(12) United States Patent
Jang et al.

(10) Patent No.: US 7,796,434 B2
(45) Date of Patent: Sep. 14, 2010

(54) NON-VOLATILE MEMORY DEVICE AND METHOD OF OPERATING THE SAME

(75) Inventors: Chae Kyu Jang, Icheon-si (KR); Joong Seob Yang, Seongnam-si (KR); Duck Ju Kim, Icheon-si (KR); Jong Hyun Wang, Cheongju-si (KR); Seong Hun Park, Gunsan-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 195 days.

(21) Appl. No.: 12/049,253

(22) Filed: Mar. 14, 2008

(65) Prior Publication Data

US 2009/0122615 A1  May 14, 2009

(30) Foreign Application Priority Data

Nov. 9, 2007  (KR) ...................... 10-2007-0114430

(51) Int. Cl.
*G11C 16/04* (2006.01)

(52) U.S. Cl. ............................ 365/185.18; 365/185.24; 365/185.29; 365/189.09; 365/189.12

(58) Field of Classification Search ............ 365/185.18, 365/185.24, 185.29, 189.09, 189.12
See application file for complete search history.

(56) References Cited

U.S. PATENT DOCUMENTS

| 5,724,289 | A  | * | 3/1998 | Watanabe | ................... 365/201 |
| 6,181,606 | B1 | * | 1/2001 | Choi et al. | ............. 365/185.23 |
| 6,266,276 | B1 | * | 7/2001 | Odani | ................... 365/185.18 |
| 7,050,333 | B2 | * | 5/2006 | Matsue | ................... 365/185.28 |

FOREIGN PATENT DOCUMENTS

KR     1020040008532 A    1/2004

\* cited by examiner

*Primary Examiner*—Pho Miner Luu
(74) *Attorney, Agent, or Firm*—Townsend and Townsend and Crew LLP

(57) ABSTRACT

Program voltages of a non-volatile memory device are controlled variably according to a program/erase operation count. The non-volatile memory device includes a program voltage supply unit for applying a program voltage to a memory cell, a program/erase count storage unit for storing a total program/erase operation count of the non-volatile memory device, a program start voltage storage unit for storing levels of program start voltages to be differently supplied according to the program/erase operation count, and a program voltage controller for controlling the program start voltage according to the program/erase operation count.

9 Claims, 5 Drawing Sheets

(1) Distribution of threshold voltage when program/erase count is 1

(2) Distribution of threshold voltage when program/erase count is 1K

⋮

(3) Distribution of threshold voltage when program/erase count is NK

Program voltage of ISPP (1) First program ISPP program voltage (2) ISPP program voltage when program/erase count is 1K (3) ISPP program voltage when program/erase count is NK (1) Distribution of threshold voltage when program/erase count is 1

(2) Distribution of threshold voltage when program/erase count is 1K

⋮

(3) Distribution of threshold voltage when program/erase count is NK

NON-VOLATILE MEMORY DEVICE AND METHOD OF OPERATING THE SAME

CROSS-REFERENCES TO RELATED APPLICATIONS

The present application claims priority to Korean patent application number 10-2007-114430, filed on Nov. 9, 2007, which is incorporated by reference in its entirety.

BACKGROUND OF THE INVENTION

The present invention relates to a non-volatile memory device and a method of operating the same, in which program voltages of a non-volatile memory device are controlled variably according to a program/erase operation count.

Recently, there is an increasing demand for non-volatile memory devices which can be electrically programmed and erased, and do not need the refresh function of rewriting data at regular intervals.

When using such a non-volatile memory device, program/erase operations are continuously repeated. As the repetition number is increased, the program speed of each memory cell increases.

In order to prevent this phenomenon and make the program speed constant, a method of applying a low program start voltage at the time of an initial program operation is frequently used. In other words, according to this method, in performing the program operation using an Incremental Step Pulse Program (ISPP) method, a program start voltage lower than a program voltage at normal operation is applied to prevent the program speed from increasing.

However, in this case, since the program start voltage is low, there is a problem in that the time required for programming from the start step to other steps is lengthened.

Accordingly, there is a need for a non-volatile memory device that is able to prevent the program speed increase phenomenon according to the repetition of the program/erase operations while not increasing overall program time.

BRIEF SUMMARY OF THE INVENTION

The present invention is directed towards a non-volatile memory device, in which a program start voltage is reset according to a preset program/erase operation count.

Further, the present invention provides a method of operating the non-volatile memory device.

In an aspect of the invention, a non-volatile memory device includes a program voltage supply unit for applying a program voltage to a memory cell, a program/erase count storage unit for storing a total program/erase operation count of the non-volatile memory device, a program start voltage storage unit for storing levels of program start voltages to be differently supplied according to the program/erase operation count, and a program voltage controller for controlling the program start voltage according to the program/erase operation count.

In another aspect of the invention, a method of operating a non-volatile memory device includes repeatedly performing program/erase operations according to a specific program start voltage until a program/erase count corresponds to a first reset reference value; when the program/erase count corresponds to the first reset reference value, decreasing the specific program start voltage; and repeatedly performing program/erase operations according to the decreased program start voltage until the program/erase count corresponds to a second reset reference value that is greater than the first reset reference value.

In still another aspect of the invention, a method of operating a non-volatile memory device includes providing a plurality of reset reference values that are arranged in an ascending order, and whenever a program/erase operation count reaches a specific reset reference value while program/erase operations are performed repeatedly, decreasing a program start voltage and then executing the program/erase operations.

DESCRIPTION OF SPECIFIC EMBODIMENTS

Specific embodiments according to the present invention will be described with reference to the accompanying drawings.

The present invention is not limited to the disclosed embodiments, but may be implemented in various manners. The embodiments are provided to complete the disclosure of the present invention and to allow those having ordinary skill in the art to understand the scope of the present invention. The present invention is defined by the scope of the claims.

Figure 1A:
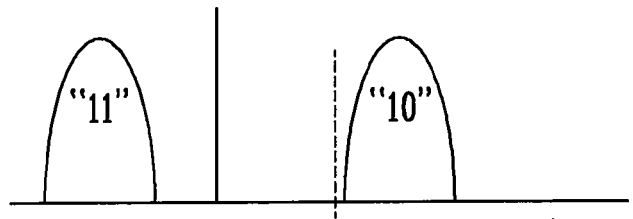
FIG. 1A is a view illustrating distributions of the threshold voltage depending on the repetition of program/erase operations of a conventional non-volatile memory device.
Figure 1A:
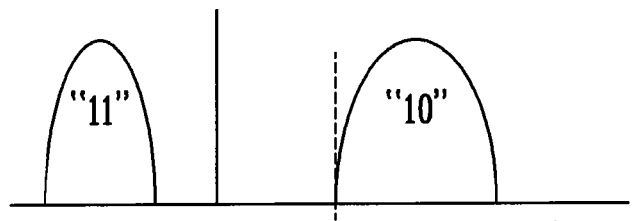
Figure 1A:
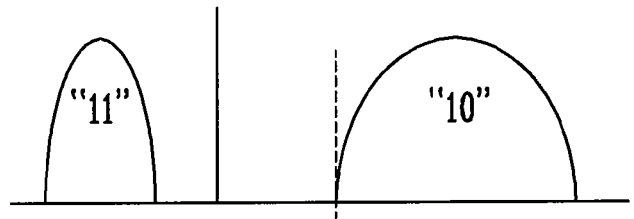
Figure 1B:
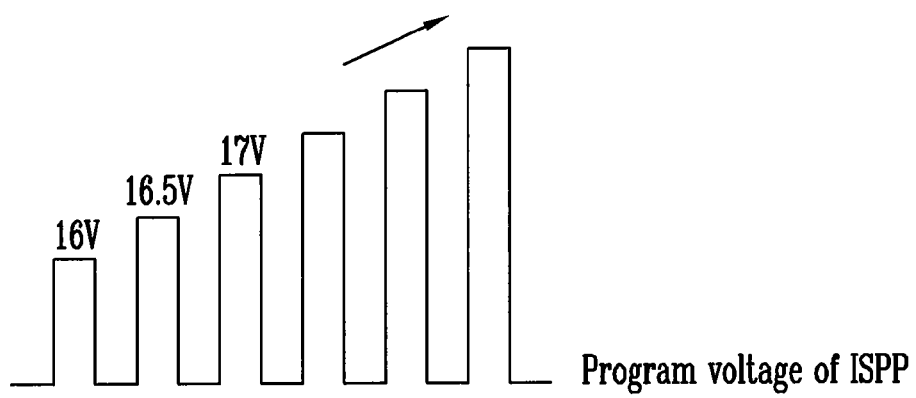
FIG. 1B is a view illustrating program voltages applied at the time of the program operation of a non-volatile memory device.

FIG. 1A is a view illustrating distributions of the threshold voltage depending on the repetition of program/erase operations of a conventional non-volatile memory device. FIG. 1B is a view illustrating program voltages applied at the time of the program operation of a non-volatile memory device.

A first graph of FIG. 1A shows distributions of the threshold voltage when the program/erase operation count is 1.

A second graph of FIG. 1A shows distributions of the threshold voltage when the program/erase operation count is 1K (1000). It can be seen that distributions of the threshold voltage of a programmed cell are widened when compared with the first graph.

A third graph of FIG. 1A shows distributions of the threshold voltage when the program/erase operation count is further increased. It can be seen that distributions of the threshold voltage of a programmed cell are further widened when compared with the first and second graphs.

This is because as the program/erase operation count is increased, the program speed of a non-volatile memory cell also increases. In other words, although the same program voltage is applied, the number of cells that are programmed more rapidly is increased as the program/erase operations are repeated.

Despite this tendency, program voltages are applied to respective cells in the same manner, as shown in FIG. 1B.

Program pulses that are increased regularly on the basis of the same start voltage are applied to the cells according to the ISPP method.

The same program voltage is applied irrespective of the program/erase operation count as described above. Thus, if the program operation is performed in a state where the program/erase operation count is increased, distributions of the threshold voltage of a corresponding cell are widened as in the third graph of FIG. 1A.

Where a multi-level cell programming method is widely applied to the operation of a non-volatile memory device, it is necessary to solve the problem that distributions of the threshold voltage are widened according to the program/erase operation count as described above.

Figure 2:
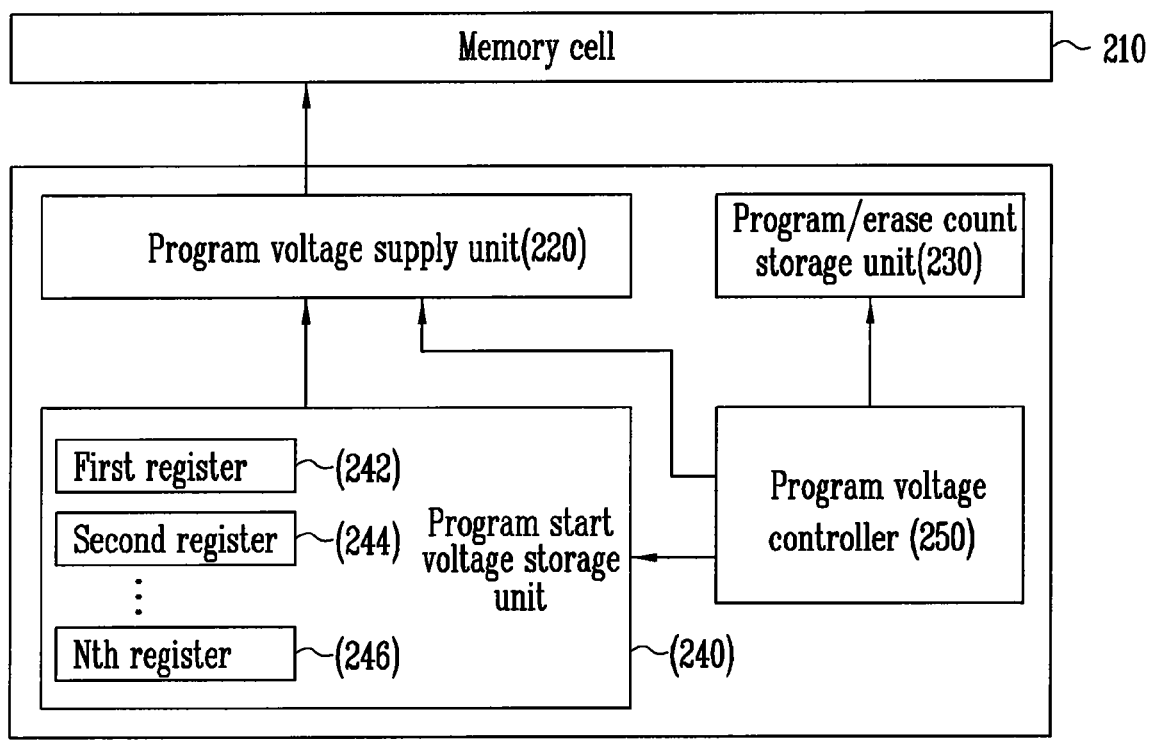
FIG. 2 is a view illustrating a non-volatile memory device according to an embodiment of the present invention.

FIG. 2 is a view illustrating a non-volatile memory device according to an embodiment of the present invention.

A non-volatile memory device 200 includes a memory cell 210 into which data is programmed, a program voltage supply unit 220 for applying a program voltage to the memory cell 220, a program/erase count storage unit 230 for storing a total program/erase operation count of a non-volatile memory device, a program start voltage storage unit 240 for storing the levels of program start voltages to be supplied according to the program/erase operation count, and a program voltage controller 250 for controlling the program start voltages to be changed according to the program/erase operation count.

Each of the constituent elements is described in more detail below.

The memory cell 210 corresponds to a non-volatile memory cell. As mentioned above, the program speed of the memory cell 210 is increased according to the program/erase operation count. Thus, a program voltage that is modified by reflecting this tendency is applied to the memory cell 210.

The program voltage supply unit 220 supplies a program voltage to the memory cell 210.

The program voltage supply unit 220 continuously increases a program start voltage as much as a step voltage according to the ISPP method and supplies an increased program start voltage to the memory cell 210.

The program voltage supply unit 220 changes and supplies the program start voltage under the control of the program voltage controller 250.

If it is determined that the program/erase operation count is increased and the program speed is increased, the program voltage supply unit 220 lowers the program start voltage under the control of the program voltage controller 250 and supplies a lowered program start voltage. A degree in which the program start voltage is lowered and supplied is referred to as a unit step voltage. For example, assuming that the step voltage is 0.5V, if it is determined that the program speed is high, the program start voltage is decreased on a 0.5V basis.

The program/erase count storage unit 230 stores a total program/erase operation count that is performed while the non-volatile memory device is operated.

When the supply of power to the non-volatile memory device is stopped, memory having a non-volatile characteristic is configured so that it can store a corresponding count.

As shown in the drawing, the memory is included in the controller. However, the memory may be included in a memory region, if needed.

The program start voltage storage unit 240 includes a plurality of registers 242, 244, and 246 for storing the levels of a plurality of program start voltages to be supplied according to a program/erase count.

The program start voltage storage unit 240 stores the levels of program start voltages suitable for respective program erase/counts, and then supplies corresponding data to the program voltage supply unit 220 under the control of the program voltage controller 250.

For example, the level of a first program start voltage may be stored in the first register 242 and then transferred to the program voltage supply unit 220. The level of a second program start voltage may be stored in the second register 244 and then transferred to the program voltage supply unit 220. In a similar way, the level of an $N^{th}$ program start voltage may be stored in an $N^{th}$ register 246 and then transferred to the program voltage supply unit 220.

Respective program start voltages may be stored by a difference of a step voltage according to the ISPP method in each embodiment.

That is, when the program start voltage is 16V and the step voltage is 0.5V, 16V may be stored in the first register, 15.5V may be stored in the second register, 15V may be stored in the third register, and so on.

In addition to the above method in which the program start voltage is decreased linearly as described above, the program start voltage may be stored so that it is decreased non-linearly depending on characteristics of a non-volatile memory device.

The program voltage controller 250 determines whether the program voltage will be decreased according to the program/erase operation count.

In the present invention, the program start voltage is reset on a count basis by reflecting the characteristics of non-volatile memory cells whose program speed increases as the program/erase operation count is increased.

The program/erase operation count for resetting the program start voltage is referred to as a reset reference value Ref (n).

For example, the reset reference value may be set as follows.

Ref(n)={1, 1K, 5K, 10K, 15K, 20K . . . }
Ref(n)={1, 1K, 10K, 20K, 30K . . . },
or Ref(n)={1, 1K, 10K, 100K, 1000K . . . }

The reset reference value may be changed by a designer depending on the characteristics of a non-volatile memory device.

When the reset reference value is changed, the program start voltage may be changed by decreasing an amount of voltage.

In other words, assuming that a program start voltage that is applied for the first time when the program/erase operations are not performed is Vs(0), when it becomes the reset reference value, the program start voltage is changed and applied. The program start voltage results in Vs(n).

When n=0, that is, at the time of an initial program operation, a first program start voltage Vs(1) stored in the first register 242 is transmitted to the program voltage supply unit 220.

When n=1, that is, when the program/erase operation count is the same as a first reset reference value Ref(1), a second program start voltage Vs(1) stored in the second register 244 is applied to the program voltage supply unit 220.

When n=N, that is, when the program/erase operation count is the same as an $N^{th}$ reset reference value Ref(N), a $(N+1)^{th}$ program start voltage Vs(N) stored in the $(N+1)^{th}$ register 246 is applied to the program voltage supply unit 220.

A detailed operation of the non-volatile memory device is described below.

Figure 3:
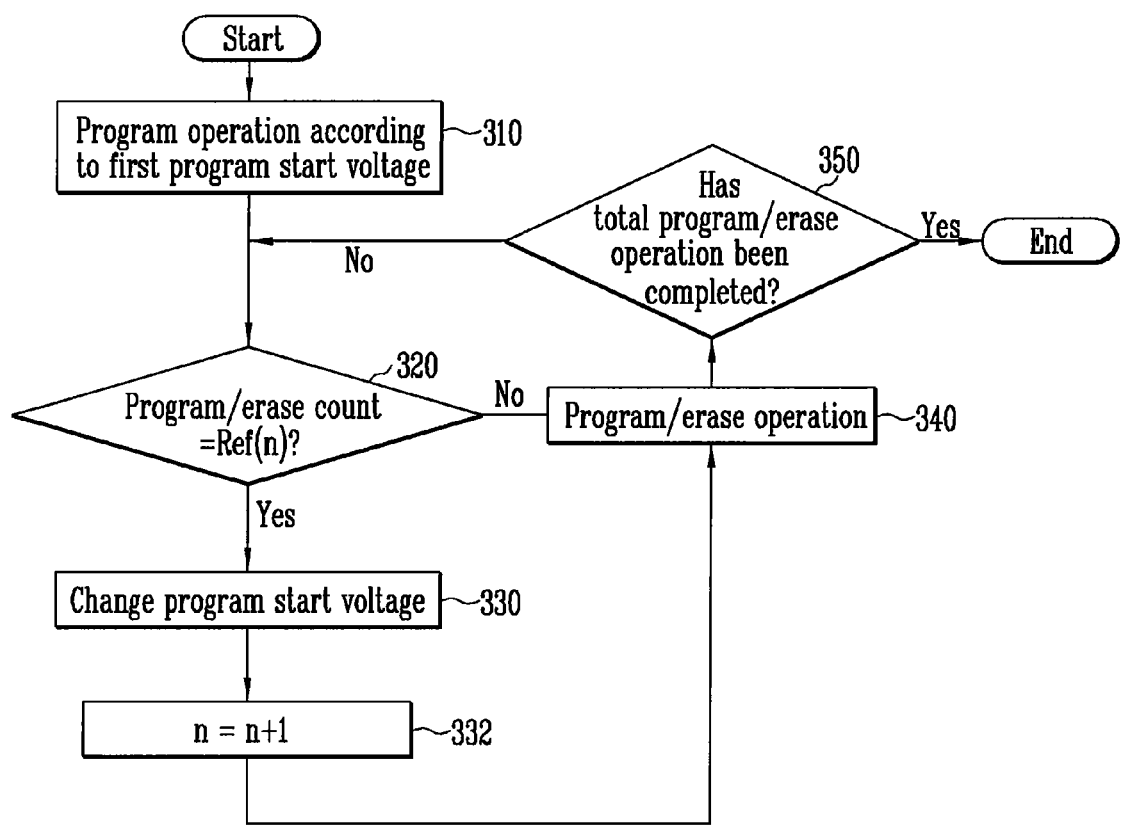
FIG. 3 is a flowchart illustrating a method of operating the non-volatile memory device.

FIG. 3 is a flowchart illustrating a method of operating the non-volatile memory device.

A program operation is started according to a first program start voltage in step 310.

Initially, the program/erase operation count does not have a great influence on the device. Thus, a typical program start voltage is applied.

It is then determined whether the program/erase operation count corresponds to a specific reset reference value in step 320.

The reset reference value refers to a program/erase operation count for resetting the program start voltage and an embodiment thereof has been described above.

If, as a result of step 320, it is determined that the program/erase operation count does not correspond to the specific reset reference value, the program/erase operations are performed repeatedly in step 340.

If a target program/erase operation count is reached during the operation in step 350, the operation is stopped. This does not mean that the embodiment of FIG. 3 is not stopped. That is, the operation may be temporarily stopped according to an application, but if a non-volatile memory device is operated again, the algorithm may be performed again.

If, as a result of step 320, it is determined that the program/erase operation count corresponds to the specific reset reference value, the program start voltage is changed in step 330.

In a current state, the program/erase operation count is identical to the first reset reference value Ref(1). Thus, the second program start voltage Vs(1) stored in the second register 244 of the program start voltage storage unit 240 is applied to the program voltage supply unit 220.

The reset reference value is then changed in step 332.

The reset reference value is changed to a second rank reset reference value. The program/erase operations are repeatedly performed until the second rank reset reference value is reached in step 340.

As the program/erase operation count is increased, the determination step 320 is performed again. Thereafter, a third program start voltage Vs(2) appropriate for a second reset reference value Ref(2) is applied to the program voltage supply unit 220.

After the program/erase operation count is increased continuously and the determination step 320 is performed several times, an $(N+1)^{th}$ program start voltage Vs(N) appropriate for an $N^{th}$ reset reference value Ref(N) is applied to the program voltage supply unit 220.

Figure 4A:
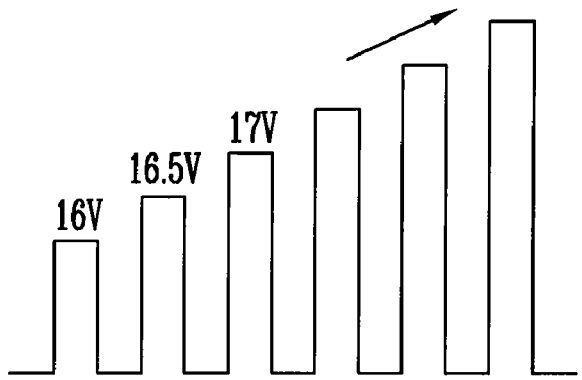
FIG. 4A is a view illustrating program voltages applied at the time of the program operation of the non-volatile memory device according to an embodiment of the present invention.
Figure 4A:
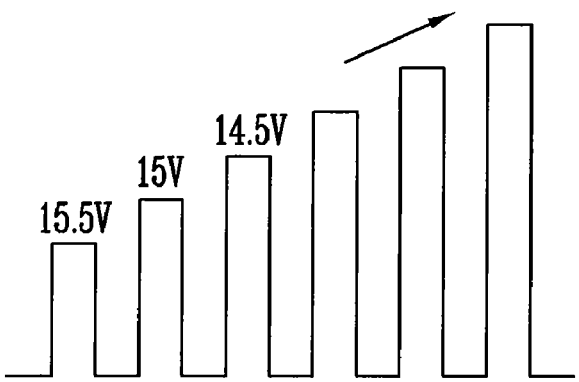
Figure 4A:
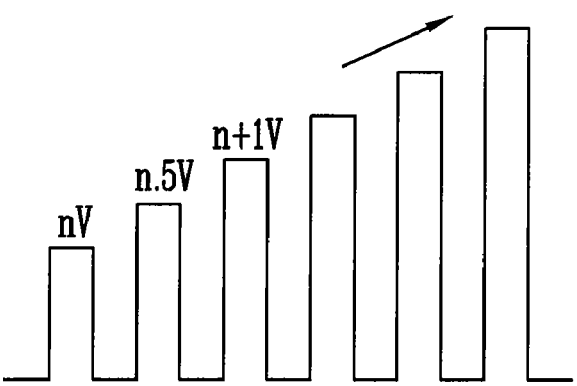
Figure 4B:
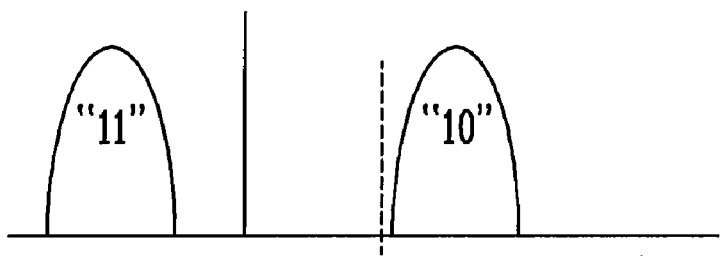
FIG. 4B is a view illustrating distributions of the threshold voltage that are expected when applying program voltages.
Figure 4B:
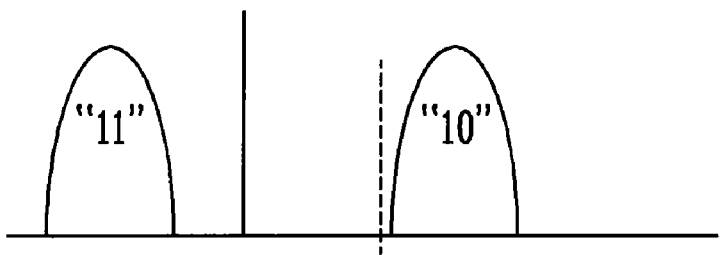
Figure 4B:
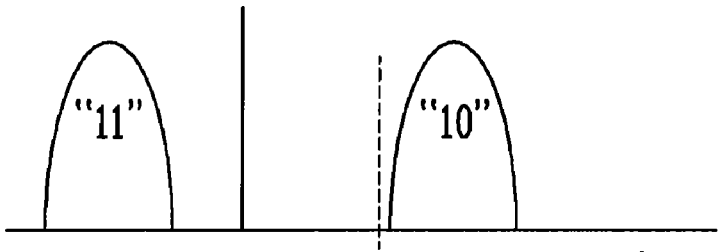

FIG. 4A is a view illustrating program voltages applied at the time of the program operation of the non-volatile memory device according to an embodiment of the present invention, and FIG. 4B is a view illustrating distributions of the threshold voltage that are expected when applying program voltages.

A first graph of FIG. 4A shows ISPP voltages applied at a first program operation. The graph shows that the program start voltage is 16V and the step voltage is 0.5V. It is to be noted that the voltage values may be changed by a designer, if appropriate.

A second graph of FIG. 4A shows ISPP voltages applied when a program/erase operation count is 1K. The graph shows that the program start voltage is 0.5V lower than the initial program start voltage and the step voltage is 0.5V. It is to be noted that the changed start voltage is only illustrative, but may be changed by a designer according to the characteristics of a memory cell.

A third graph of FIG. 4A shows ISPP voltages applied when a program/erase operation count is NK. A program start voltage nV refers to a voltage decrease from the initial program start voltage.

From FIG. 4B, it can be seen that there is not a significant difference in the distributions of the threshold voltage although the program/erase count is increased according to the present invention. In other words, even though a non-volatile memory device is operated several times, the same performance as that when the memory device was operated for the first time can be obtained.

As described above, according to the present invention, a program start voltage can be reset according to a preset program/erase operation count. That is, if a specific program/erase operation count is reached while a non-volatile memory device is operated, a program operation is performed by decreasing an ISPP start voltage.

Consequently, a phenomenon in which cells whose program speed is relatively fast exceed normal distributions of the threshold voltage can be prevented.

Further, an application number of a program pulse can be kept constant irrespective of a change of a program/erase operation count.

The present invention is not limited to the disclosed embodiments, but may be implemented in various manners. The embodiments are provided to complete the disclosure of the present invention and to allow those having ordinary skill in the art to understand the scope of the present invention. The present invention is defined by the scope of the claims.

What is claimed is:

1. A non-volatile memory device comprising:
   a program voltage supply unit for applying a program voltage to a memory cell;
   a program/erase count storage unit for storing a total program/erase operation count of the non-volatile memory device;
   a program start voltage storage unit for storing levels of, program start voltages to be differently supplied to the program voltage supply unit according to the program/erase operation count; and
   a program voltage controller to select one of the levels of the program start voltages according to the program/erase operation count.

2. The non-volatile memory device of claim 1, wherein the program/erase count storage unit comprises memory having a non-volatile characteristic in which a corresponding count can be stored even when the supply of power is stopped.

3. The non-volatile memory device of claim 1, wherein the program start voltage storage unit comprises a plurality of registers for storing different program start voltages.

4. The non-volatile memory device of claim 1, wherein when the program/erase operation count corresponds to a specific reset reference value, the program voltage controller controls the program start voltage storage unit to transfer a program start voltage, corresponding to the reset reference value, to the program voltage supply unit.

5. A method of operating a non-volatile memory device, the method comprising:
   repeatedly performing program/erase operations according to a specific program start voltage until a program/erase operation count corresponds to a first reset reference value;
   when the program/erase operation count corresponds to the first reset reference value, decreasing the specific program start voltage; and
   repeatedly performing program/erase operations according to the decreased program start voltage until the program/erase operation count corresponds to a second reset reference value that is greater than the first reset reference value.

6. The method of claim 5, wherein the decrease of the specific program start voltage includes decreasing the program start voltage as low as a step voltage and applying the decreased program start voltage.

7. The method of claim 5, further comprising setting the second reset reference value to a reset reference value after the decrease of the specific program start voltage.

8. A method of operating a non-volatile memory device, the method comprising:
   providing a plurality of reset reference values that are arranged in an ascending order; and
   when a program/erase operation count reaches a specific reset reference value while program/erase operations are performed repeatedly, decreasing a program start voltage and then executing the program/erase operations.

9. The method of claim 8, wherein the execution of the program/erase operations comprises decreasing the program start voltage as low as a step voltage until the program/erase operation count reaches a specific reset reference value.

* * * * *